United States Patent [19]

Maruyama et al.

[11] Patent Number: 5,208,134
[45] Date of Patent: May 4, 1993

[54] IMAGE-FORMING MATERIAL FOR PRODUCING A COLORED RELIEF IMAGE

[75] Inventors: Yoshikatsu Maruyama; Toshimichi Katsuoka, both of Tokyo; Yasunori Sugiyama, Urawa, all of Japan

[73] Assignee: Kimoto Co., Ltd., Japan

[21] Appl. No.: 659,271

[22] Filed: Feb. 22, 1991

[30] Foreign Application Priority Data

Feb. 28, 1990 [JP] Japan ................................ 2-48298

[51] Int. Cl.$^5$ ............................................. G03C 1/492
[52] U.S. Cl. ................................. 430/271; 430/273; 430/961
[58] Field of Search ............... 430/271, 273, 950, 961, 430/292, 920, 13

[56] References Cited

U.S. PATENT DOCUMENTS

| | | | |
|---|---|---|---|
| 3,499,781 | 3/1970 | Krueckel | 430/273 |
| 4,567,129 | 1/1986 | Held | 430/273 |
| 4,870,001 | 9/1989 | Ashida | 430/950 |
| 4,917,990 | 4/1990 | Herrmann | 430/273 |
| 4,966,827 | 10/1990 | Sullivan | 430/273 |
| 4,999,266 | 3/1991 | Platzer et al. | 430/273 |
| 5,006,447 | 4/1991 | Umeda et al. | 430/273 |

Primary Examiner—Jack P. Brammer
Attorney, Agent, or Firm—Lorusso & Loud

[57] ABSTRACT

Disclosed herein are an image-forming material and a process for forming images, which can be applied to second originals used in the field of surveying.

The image-forming material comprises a roughened plastics film substrate and a transparent resin layer, colored resin layer, photosensitive resin layer and protective layer formed one over another (in the order mentioned) on the roughened surface of the substrate, said four layers being so designed as un-exposed part thereof to be removed completely by dissolution or swelling during development after exposure to active rays. It permits the formation of a colored relief image without any dyeing step and gives rise to a good image free of base fogging without causing any decrease in printing sensitivity.

The process for forming images comprises exposing the above-mentioned image-forming material to active rays and subsequently developing the exposed image-forming material with two kinds of developing solutions consecutively, thereby forming a colored positive relief image on the roughened plastics film substrate, said development causes the un-exposed parts of the transparent resin layer, colored resin layer, photosensitive resin layer and protective layer to be removed by dissolution or swelling.

10 Claims, No Drawings

IMAGE-FORMING MATERIAL FOR PRODUCING A COLORED RELIEF IMAGE

BACKGROUND OF THE INVENTION

1. Field of the Invention

The present invention relates to an image-forming material and a process for forming images. More particularly, it is concerned with an image-forming material and a process for forming images which will be used to make negative-positive type second originals (intermediate, transparent sheets on which original drawings are duplicated) for an editorial drawing or a composite drawing in the field of surveying.

2. Related Art Statement

There have been known image-forming materials and development processes for the production of negative-positive type second originals for an editorial drawing or a composite drawing to be used in the field of surveying.

For example, Japanese Patent Laid-open No. 91419/1977 teaches a photosensitive film where photopolymer of polyvinylalcohol partly denatured with aromatic azido is coated on polyester film having sand matte surface. The photosensitive film undergoes negative exposure through an original and subsequent development with an alkaline aqueous solution, dyeing and washing for the formation of a positive relief image.

The above-mentioned conventional image-forming processes have an advantage of being capable of forming a colored positive relief image of the original drawing on a roughened plastic film substrate. However, they also have the disadvantage that the step of dyeing a positive relief image in the development process stains the operator's body and clothing and the working environment with the dye solution used in that step. This problem has been alleviated by the introduction of automatic development. This poses another problem associated with the maintenance of the automatic developing machine and the disposal of the dye waste liquid discharged from the automatic developing machine.

The second originals in the field of surveying sometimes have a color other than black, i.e. red, sepia, green or blue, to enable classification of the surveying drawings or to distinguish between added lines and originals. Accordingly, the aforementioned method including dyeing, a plurality of dye solutions for each color are required for making positive reliefs of various. As the result, a plurality of positive reliefs of different colors can not be formed at the same time using one automatic developing machine.

To address this problem, there has been proposed a method for forming a colored positive relief image without using a dye solution in the development process in Japanese Patent Laid-open No. 166946/1984.

This method consists of forming a colored photosensitive layer (containing a dye or pigment in a photopolymer of polyvinylalcohol, partially denaturated with substance combining styrylquinolinium or styrylpyridinium), on a polyester film substrate, exposing the photosensitive material for negative printing of the original, and forming a colored positive relief image by development with water.

This method obviates the use of a dye solution in the development process. A disadvantage of this method is that the photosensitive resin layer must contain a large amount of coloring component. Increasing the amount of the coloring component greatly lowers the printing sensitivity of the photosensitive resin layer, which must be compensated for by a large amount of exposure in negative printing of the original.

Moreover, when the photosensitive colored resin layer is coated on the roughened film, it tends to cause base fogging of non-imaged area due to the sticking of a dye or pigment (from the photosensitive colored resin layer) to the roughened polyester film.

SUMMARY OF THE INVENTION

The above-described drawbacks in the prior art have been successfully eliminated by the present invention.

Accordingly, it is an object of the present invention to provide an image-forming material and a process for forming images used for negative-positive type second originals for an editorial drawing or a composite drawing in the field of surveying.

It is another object of the present invention to provide an image-forming material and a process for forming images which permit the formation of a colored relief image without causing any decrease in printing sensitivity and without any dyeing step and which give rise to a good image free of base fogging.

The above-mentioned object of the present invention is achieved first by an image-forming material which comprises a roughened plastics film substrate and a transparent resin layer, colored resin layer, photosensitive resin layer and protective layer formed one over another (in the order mentioned) on the roughened surface of the substrate, said four layers being such that un-exposed portions thereof may be removed completely by dissolution or swelling during development after exposure.

The above-mentioned object of the present invention is achieved secondly by a process for forming images which comprises negative exposing the above-mentioned image-forming material to radiation and subsequently developing the exposed image-forming material with a first developing solution and a second developing solution consecutively, thereby forming a colored positive relief image on the roughened plastics film substrate, said first developing solution being an aqueous solution having a pH value 10.0 or above and containing a water-miscible organic solvent and/or anionic surface active agent, said second developing solution being an aqueous solution having a pH value lower than 10.0 and containing a water-miscible organic solvent and/or anionic surface active agent.

These and other objects of the invention will become more apparent in reading the detailed description and examples which follow.

DETAILED DESCRIPTION OF THE INVENTION

The invention will be described in more detail in the following.

The image-forming material of the present invention has a plastic film substrate which is formed by roughening one or both sides of a transparent plastic film such as polyethylene terephthalate film, triacetate film, polycarbonate film, polyvinyl chloride film, polystyrene film, polypropylene film, and polysulfone film. The surface roughening is accomplished by sand blasting, etching, coating, or embossing. The surface roughness is from 0.25 $\mu$m to 1.25 $\mu$m in terms of Arithmetical mean deviation (Ra, ISO 468-1982 Surface Roughness).

The plastic film substrate should have the above-specified specified surface roughness so that the image-forming material forms a second original which is receptive to a pencil, aqueous ink, and oil-based ink for retouching after image-forming.

A preferred example of the roughened plastic film substrate is a transparent polyethylene terephthalate film, with the surface thereof roughened to such an extent that the Arithmetical mean deviation is from 0.25 μm to 1.25 μm. It is superior in mechanical strength, dimensional stability, and chemical resistance. It is prepared by roughening a polyethylene terephthalate film, 50 μm to 200 μm thick, by the sand blasting method.

The roughened plastic film substrate should preferably undergo surface treatment such as corona discharge treatment for the improvement of adhesion to the transparent resin layer to be formed thereon.

According to the present invention, the roughened plastic film substrate is coated with the transparent resin layer, which is intended to prevent base fogging. It is prepared from a film-forming resin which is insoluble in distilled water but soluble in or swellable by the first and second developing solutions (mentioned later). Examples of such a resin include (meth)acrylic acid-(meth)acrylate ester copolymer, (meth)acrylic acid-2-hydroxyethyl (meth)acrylate-(meth)acrylonitrile-(meth)acrylate ester copolymer, partially esterified products of styrene-maleic anhydride copolymer, polyvinyl-p-hydroxy-benzal, and alkali-soluble novolak-type phenolic resin. These resins may be used alone or in combination with one another.

The transparent resin layer should be 0.1 μm to 5 μm in thickness (after drying). With a thickness smaller than 0.1 μm, the transparent resin layer hardly prevents base fogging. With a thickness greater than 5 μm, the transparent resin layer permits development more than necessary, with the result that fine lines are undesirably dropped out.

According to the present invention, the colored resin layer is composed of a binder resin and a coloring agent. The binder resin is a film-forming resin soluble in or readily swellable by the first and second developing solutions. Examples of such a resin include hydroxypropyl methylcellulose phthalate, methyl vinyl ether-maleic anhydride ester copolymer, polyvinyl pyrrolidone-vinyl acetate copolymer, dimethylamino-modified polyamide, (meth)acrylic acid-(meth)acrylate ester copolymer, (meth)acrylic acid-2-hydroxyethyl (meth)acrylate-(meth)acrylonitrile-(meth)acrylate ester copolymer, partially esterified products of styrene-maleic anhydride copolymer, polyvinyl butyral, polyvinyl-p-hydroxybenzal, and alkalisoluble novolak-type phenolic resin. These resins may be used alone or in combination with one another.

The coloring agent used for the colored resin layer is selected from pigments rather than dyes, because the former is less liable to cause base fogging. Any known inorganic or organic pigment may be used in the present invention. Examples of the organic pigment include known azo-pigments and phthalocyanine pigments. These pigments may be used alone or in combination with one another so that the colored resin layer assumes a red color, sepia color, green color, or blue color as desired. A preferred color pigment is one which gives rise to a high optical density per unit weight added. Pigments for the colored resin layer of black color include carbon black, graphite powder, nickel powder, and titanium black. Preferable among them is carbon black, which gives rise to a high optical density per unit weight added.

The following are commercial pigments that can be used for individual colors.

Black
  Carbon black #40, MA-100 (made by Mitsubishi Kasei)
  Printex 55, 90 (made by Degussa)
Red
  Seikafast red 1547 (made by Dainichi Seika)
  Seikafast carmine 3840 (made by Dainich Seika)
  Pariogen red K3580 (made by BASF)
  Pariogen red L3530 (made by BASF)
Sepia
  Transoxide red (made by Hilton-Davis)
  Sicotrans red L27150D (made by BASF)
Green
  Phthalocyanine green 6YS (made by Sanyo Shikiso)
  Heliogen green 6G (made by BASF)
Blue
  Cyanine blue 5060 (made by Dainichi Seika)
  Heliogen blue D7100 (made by BASF)

The colored resin layer should be 0.3 μm to 15 μm, preferably 0.5 μm to 5 μm, in thickness (after drying). With a thickness smaller than 0.3 μm, the colored resin layer does not give rise to an adequate uniform optical density and the colored resin layer is susceptible to pinholes. With a thickness greater than 15 μm, the colored resin layer does not produce a colored relief image of high resolution after development.

The colored resin layer should be composed of the binder resin in an amount of 100 parts by weight and the coloring agent in an amount of 10–300 parts by weight, preferably 30–150 parts by weight, so that it gives rise to an adequate optical density for each color according to the layer thickness. The colored resin layer specified as above provides a good resolution after development according to the process of the present invention.

According to the present invention, the photosensitive resin layer is composed of photo-polymerizing photosensitive mixture, containing, at least, a resin soluble in or swellable by the developing solution, photo polymerizable monomer and photo-polymerization initiator.

Examples of such resin include (meth)acrylate ester copolymer or (meth)acrylic acid-(meth)acrylate ester copolymer, which contains at least one unsaturated compound for addition polymerization as a copolymerizing monomer selected from (meth)acrylic acid, 2-hydroxyethyl (meth)acrylate, 2-hydroxypropyl (meth)acrylate, 2-hydroxybutyl (meth)acrylate, 3-chloro-2-hydroxypropyl (meth)acrylate, dimethyl aminoethyl (meth)acrylate, diethyl aminoethyl (meth)acrylate, (meth)acrylic amide and further contains another unsaturated compound for addition polymerization as copolymerizing monomer selected from methyl (meth)acrylate, ethyl (meth)acrylate, methoxyethyl (meth)acrylate, ethoxyethyl (meth)acrylate, butoxyethyl (meth)acrylate, n-propyl (meth)acrylate, iso-propyl (meth)acrylate, n-butyl (meth)acrylate, iso-butyl (meth)acrylate, t-butyl (meth)acrylate, amyl (meth)acrylate, hexyl (meth)acrylate, cyclohexyl (meth)acrylate, ethylhexyl (meth)acrylate, heptyl (meth)acrylate, n-octyl (meth)acrylate, t-octyl (meth)acrylate, nonyl (meth)acrylate, decyl (meth)acrylate, (meth)acrylonitrile, vinyl esters, vinyl ketones, styrenes.

Other examples of suitable resin include partially esterified products of styrene-maleic anhydride copolymer, styrene-p-hydroxystyrene copolymer, and novolak-type phenolic resin. These resins may be used alone or in combination with one another.

The unsaturated monomer having acrylol for addition polymerization is used for the photo-polymerizing monomer. Examples of the monomer include poly-functional acrylate, e.g., 1,6-hexan diol diacrylate, polyethylene glycol 200 diacrylate, diethylene glycol diacrylate, neopentyl glycol diacrylate, triethylene glycol diacrylate, hydroxy pivaric acid ester neopentyl glycol diacrylate, bis(acryloxy ethoxy) bisphenol A, bis(acryloxy polyethoxy) bisphenol A, trimethylol propane triacrylate, ethylene oxide denaturated trimethylol propane triacrylate, propylene oxide denaturated trimethylol propane triacrylate, pentaerythritol triacrylate, pentaerythritol tetraacrylate, dipenta-erythritol hexaacrylate. These monomers may be used alone or in combination with one another.

Examples of the photo-polymerization initiator include acetophenone, p-dimethyl acetophenone, benzophenone, dichlorobenzophenone, Michler's ketone(4-4'-bis dimethyl aminobenzophenone), 4-4'-bis diethyl aminobenzophenone, benzyl, benzoin, benzoin methylether, benzoin ethylether, benzoin propylether, benzoin n-propylether, benzoin isobutylether, benzoin n-butylether, 2-chlorothioxanthone, 2-methylthioxanthone, azobis isobutylnitryl, benzoin peroxide, 2,4,5-triphenyl imidazole dimers. These initiators may be used alone or in combination with one another. Agents for preventing thermo-polymerization such as hydroquinone may be added to the photosensitive resin layer of the present invention, as needed.

The compositions contain 10–80 wt. % of the resin, 10–40 wt. % of the photo-polymerizing monomer and 1–20 wt. % of the photo-polymerization initiator. The additives, e.g. photosensitizer, anti-thermopolymerization agents, may be added in an amount of 10 wt. % or less.

The photosensitive resin layer should be 0.5 $\mu$m to 10 $\mu$m, preferably 1 $\mu$m to 5 $\mu$m, in thickness (after drying), so that the resulting image-forming material can be printed exposing 100 mJ/cm$^2$ or less and has a high resolving power (higher than 20 lines/mm), without the possibility of causing pin-holes in the image.

The protective layer formed on the photosensitive resin layer suppresses the decrease of the sensitivity by shutting the photosensitive layer off from air and functions as preventing blocking, making the exposed surface smooth, enhancing even vacuum suction when printing and so on. This protective layer consists of a film forming resin being soluble in water alone or the first developing solution of the present invention and fine particles for giving roughness to the layer.

For the film forming resin of the protective layer, polyvinyl alcohol soluble in water at room temperature may be used. The examples of the fine particles are inorganic pigment such as calcium carbonate, barium sulfate, silicon dioxide, or fine particles of polymer, e.g. acrylic resin, epoxy resin, nylon resin, polyethylene resin, fluorine resin and so on.

The fine particles are added in such amount that transparency to actinic rays does not decrease markedly. The protective layer should be 0.1$\mu$ to 10$\mu$, preferably 0.3$\mu$ to 3$\mu$, in thickness, so that it adds the above-mentioned functions to the photosensitive layer and does not suppress the image forming ability of the photosensitive layer.

The image-forming material of the present invention is prepared by coating the roughened plastic film substrate with the above-mentioned transparent resin layer, colored resin layer, photosensitive resin layer and protective layer formed one over another. To form each layer, the binder resin is dissolved in a solvent and necessary components are added to the solution, and the resulting solution is applied, followed by drying, to give a desired coating thickness. Solvents for the binder resin include distilled water, alkaline aqueous solutions, and organic solvents such as hydrocarbons, halogenated hydrocarbons, alcohols, ethers, acetals, ketones, esters, polyhydric alcohols and derivatives thereof, fatty acids, phenols, and nitrogen compounds. When necessary components are added to the binder resin solution, their dispersion may be promoted by the aid of any known dispersing means such as ball mill, sand grinder, attritor, roll mill, and high-speed impeller. The coating of each layer on the roughend plastic film substrate may be accomplished by the rod coating method, knife coating method, reverse roll coating method, gravure coating method, or kiss roll coating method. The wet coating is subsequently dried by blowing hot air (50° C. to 150° C.). The above-mentioned steps are repeated to form the image-forming material of the present invention.

The image-forming material of the present invention which is prepared as described above is used in the following manner to produce an image on it. According to the process of the present invention, the image-forming material is exposed to actinic rays and then developed with specific developing solutions, so that the transparent resin layer, colored resin layer, photosensitive resin layer and protective layer which have been unexposed are completely removed by dissolution or swelling. The exposure and subsequent development give rise to a colored positive relief image on the substrate.

The actinic rays are those which efficiently bring about the photochemical reaction of the photosensitive resin layer. To be specific, they are light having a wavelength of 300 nm to 500 nm. Such light is obtained by a light source such as carbon arc lamp, extra-high pressure mercury lamp, metal halide lamp, and micro-wave excited electrodeless lamp.

According to the process of the present invention, two developing solutions are used, a first developing solution having a higher pH value and a second developing solution having a lower pH value.

The first developing solution is an alkaline aqueous solution having a pH value of 10.0 or above. It contains one or more alkaline substances such as sodium hydroxide, potassium hydroxide, sodium silicate, sodium carbonate, trisodium phosphate, and triethanolamine. It also contains an organic solvent and/or anionic surface active agent which are miscible with said alkaline aqueous solution.

Examples of the organic solvent include alcohols and polyhydric alcohol derivatives, such as isopropyl alcohol, benzyl alcohol, phenylcellosolve, and butyl cellosolve. The amount of the organic solvent should be less than 10 parts by weight, preferably less than 5 by weight, for 100 parts by weight of said alkaline aqueous solution.

Examples of the anionic surface active agent include alkylsulfate ester salt, alkylbenzenesulfonate salt, alkylnaphthalenesulfonate salt, and dialkylsulfosuccinate salt. Typical examples that can be used are sodium lauryl sulfate, sodium dodecylbenzenesulfonate, and isopropylnaphthalene sulfonate. The amount of the anionic surface active agent should be less than 20 parts by weight, preferably less than 10 parts by weight, for 100 parts by weight of said alkaline aqueous solution. The anionic surface active agent may be used alone or in combination with said organic solvent.

The second developing solution is an aqueous solution having a pH value lower than 10.0. it contains no alkaline substances but contains any of said organic solvents and anionic surface active agents in the same amount as in the case of the first developing solution. Incidentally, both the first and second developing solutions may contain an anti-foaming agent such as silicone emulsion, if necessary.

The first and second developing solutions contain no dyes and hence are substantially colorless, because they do not need to color the relief image in the course of development.

According to the process of the present invention, the image-forming material of the present invention is developed by dipping it in the first developing solution and the second developing solution consecutively for 5 seconds to 3 minutes each. The developing solutions should be kept at 10° C. to 50° C., preferably 20° C. to 40° C. The developing speed may be properly controlled by rubbing the image-forming material in the developing bath or by washing the image-forming material with tap water when it is transferred from the first developing solution to the second one.

As the result of development, the unexposed parts of the transparent resin layer, colored resin layer, photosensitive resin layer and the protective layer are completely removed, with the result that the exposed parts form the colored relief image and the surface of the roughened plastic film appears where the unexposed portions were located.

What is obtained after development is the roughened plastic film which is free of base fogging and receptive to retouching ink because the transparent resin layer is completely removed from the surface of the roughened plastic film.

EXAMPLES

The invention will be described in more detail with reference to the following examples.

EXAMPLE 1

A 100-μm thick transparent polyethylene terephthalate film (as a substrate) was roughened by sand blasting so that its surface has the Arithmetical mean deviation of 0.70 μm. The roughened surface underwent corona discharge treatment. To the roughened surface was applied the coating solution of the transparent resin layer (explained below) using a wire bar, followed by drying with hot air at 90° C. for 2 minutes. Thus there was formed the transparent resin layer (0.5 μm thick) on the roughened surface of the substrate. Subsequently, on the transparent resin layer was formed the colored resin layer (1.5 μm thick) from the coating solution (described below) in the same manner as mentioned above.

| Coating solution for transparent resin layer: | |
|---|---|
| Polyvinyl p-hydroxy benzal | 2 pbw |
| Methyl cellosolve | 30 pbw |
| Ethyl alcohol | 26 pbw |
| Coating solution for colored resin layer: | |
| Carbon black ("MA-100" made by Mitsubishi Kasei) | 2 pbw |
| Methacrylic acid-methacrylic ester copolymer (methyl methacrylate = 30 mol %, 2-hydroxyethyl methacrylate = 40 mol %, methacrylonitrile = 27 mol %, and methacrylic acid = 3 mol %) | 4 pbw |
| Distilled water | 80 pbw |
| 28% ammonia water | 1 pbw |
| Silicone surface active agent ("FS-XB-2725" made by Dow Corning) | 1 pbw |

Finally, on the colored resin layer was formed the photosensitive resin layer (3 μm thick) from the coating solution (described below) and the protective layer (0.8 μm thick) from the coating solution (described below) successively in the same manner as mentioned above.

| Coating solution for photosensitive resin layer | |
|---|---|
| Methacrylate ester copolymer (methyl methacrylate = 50 mol %, butyl methacrylate = 10 mol %, 2-hydroxyethyl methacrylate = 20 mol %, dimethyl aminoethyl methacrylate = 20 mol %) | 10 pbw |
| Dipenta erythlytol hexaacrylate | 5 pbw |
| Benzophenone | 0.5 pbw |
| Michler's ketone | 0.3 pbw |
| p-Methoxy phenol | 0.02 pbw |
| Ethyl acetate | 60 pbw |
| butyl acetate | 30 pbw |
| Coating solution for protective layer | |
| Polyvinyl alcohol (GOHSENOL KH-17 made by Nihon Gousel Kagaku) | 4 pbw |
| Fine particles of silicone dioxide (SYLOID 978 made by Fuji Devison Kagaku) | 0.1 pbw |
| Distilled water | 90 pbw |
| Isopropyl alcohol | 6 pbw |
| Silicone surface active agent ("FS-XB-2725" made by Dow Corning) | 0.05 pbw |

Example 2 to 5

Image-forming materials in accordance with the present invention were prepared in the same manner as in Example 1 except that the coating solution for the colored resin layer was replaced by one containing the coloring agent as shown in Table 1.

TABLE 1

| Example No. | Coloring agent | Color |
|---|---|---|
| Example 2 | Seikafast carmine 3840 (made by Dainichi Seika) | Red |
| Example 3 | Transoxide red (made by Hilton-Davis) | Sepia |
| Example 4 | Phthalocyanine green 6YS (made by Sanyo Shikiso) | Green |
| Example 5 | Cyanine blue 5060 (made by Dainichi Seika) | Blue |

Examples 6 and 7

Image-forming materials pertaining in accordance with the present invention were prepared in the same manner as in Example 1 except that the coating solution for the transparent resin layer was replaced by the following.

| Coating solution for transparent resin layer (Example 6) | |
|---|---|
| Acrylic acid-methacrylate ester copolymer (SR-102 made by Go-oh Kagaku) | 10 pbw |
| Ethyl alcohol | 60 pbw |

-continued

| Coating solution for transparent resin layer (Example 7) | |
|---|---|
| Partially esterified product of styrene-maleic anhydride copolymer ("Styrite CM-2L" made by Daido Kogyo) | 2 pbw |
| Methyl cellosolve | 30 pbw |
| Ethyl alcohol | 26 pbw |

Example 8

An image-forming material in accordance with the present invention was prepared in the same manner as in Example 1 except that the roughened plastic film (roughened by sand blasting) was replaced by "Microtrace #400 HPB" (made by Kimoto), which is a 120-μm thick roughened plastic film with the Arithmetical mean deviation of 0.9 μm, formed by the surface coating method.

The image-forming materials obtained in Examples 1 to 8 were exposed for 15 seconds to light from an extra-high pressure mercury lamp (2 kW) placed 1 meter away, through negative originals. After exposure, they underwent development under the following conditions so that a positive colored relief image was formed on the roughened plastic film substrate. The performance of the relief image is shown in Table 2.

| Developing process | |
|---|---|
| Dipping in the 1st developing solution: | 30 sec (30° C.) |
| Washing with tap water: | 10 sec (20° C.) |
| Dipping in the 2nd developing solution: | 30 sec (30° C.) |
| Washing with tap water: | 10 sec (20° C.) |
| Drying | |
| Composition of the 1st developing solution | |
| Distilled water | 200 pbw |
| Trisodium phosphate (Na₃PO₄.12H₂O) | 8 pbw |
| Solution of sodium alkylnaphthalenesulfonate ("Pelex NBL" made by Kao Co., Ltd.) | 10 pbw |
| Benzyl alcohol | 0.5 pbw |
| Composition of the 2nd developing solution | |
| Distilled Water | 200 pbw |
| Solution of sodium alkylnaphthalenesulfonate ("Pelex NBL" made by Kao Co., Ltd.) | 20 pbw |

TABLE 2

| Example No. | Color | Optical Density image | Optical Density non-image | Resolution lines/mm | Retouchability pencil | Retouchability oil-based ink | Retouchability aqueous ink |
|---|---|---|---|---|---|---|---|
| 1 | Black | 2.25 | 0.18 | ≧20 | fair | fair | good |
| 2 | Red | 0.70 | 0.18 | ≧20 | fair | fair | good |
| 3 | Sepia | 1.57 | 0.18 | ≧20 | fair | fair | good |
| 4 | Green | 1.08 | 0.18 | ≧20 | fair | fair | good |
| 5 | Blue | 1.11 | 0.18 | ≧20 | fair | fair | good |
| 6 | Black | 2.13 | 0.18 | ≧20 | fair | fair | good |
| 7 | Black | 2.18 | 0.18 | ≧20 | fair | fair | good |
| 8 | Black | 2.69 | 0.25 | ≧20 | good | good | good |

Remarks:
(1) Optical density was measured by using a Macbeth optical densitometer (TD-904) through a UV filter.
(2) Retouchability was evaluated by using a drawing instrument.

As demonstrated in the examples, the image-forming material of the present invention can be exposed through negative originals and be developed with developing solutions containing no dye solution. Therefore, it forms on the roughened plastic film substrate a colored positive relief image having a specific optical density and a high resolution.

In addition, the image-forming material of the present invention has a high printing sensitivity because it has a photosensitive resin layer containing no coloring components and has the colored resin layer under the photosensitive resin layer.

Moreover, the image-forming material of the present invention has the transparent resin layer interposed between the colored resin layer and the roughened plastic film substrate. This structure eliminates base fogging. Non-imaged parts permit baring the roughened plastic film substrate to uncover its original surface which has retouchability.

As mentioned above, the present invention provides a very good second original which is useful in the field of surveying.

Thus, there is provided in accordance with the invention an image-forming material and process for forming images which have the advantages discussed above. The embodiments described are intended to be merely exemplary and those skilled in the art will be able to make variations and modifications in them without departing from the spirit and scope of the invention. All such modifications and variations are contemplated as falling within the scope of the claims.

What is claimed is:

1. An image-forming material for photographically producing a colored relief image comprising:
   a plastic film substrate having one surface roughened to an arithmetic mean deviation of 0.25–1.25μ;
   a transparent resin non-photosensitive layer 0.1 to 5 microns thick formed on said substrate;
   a colored resin non-photosensitive layer containing a color pigment and formed on said transparent resin layer, said transparent layer separating said color pigment of said colored resin layer from said substrate to prevent fogging of said substrate by said color pigment;
   a photosensitive resin layer containing no coloring component and formed on said colored resin layer, said colored resin layer and said photosensitive resin layer being coextensive; and
   a protective layer formed on said photosensitive resin layer.

2. An image-forming material as claimed in claim 1, wherein the photosensitive resin layer consists of a photo-polymerizable photosensitive mixture containing a resin soluble in or swellable by a developing solution, a photo-polymerizable monomer and a photo-polymerization initiator.

3. An image-forming material as claimed in claim 1, wherein said color pigment causes the colored resin layer to be black, red, sepia, green or blue.

4. An image-forming material as claimed in claim 1, wherein the transparent resin layer contains at least one resin selected from the group consisting of (meth)acrylic acid-(meth)acrylate ester copolymer, partially esterified products of styrene-maleic anhydride copolymer, and hydroxybenzaldehyde-modified polyvinyl alcohol, said one resin being insoluble in distilled water but soluble in or swellable in an aqueous solution having a pH value 10.0 or above.

5. An image-forming material as claimed in claim 2, wherein the colored resin layer contains a color pigment which causes the colored resin layer to be black, red, sepia, green or blue.

6. An image-forming material as claimed in claim 2, wherein the transparent resin layer contains at least one resin selected from the group consisting of (meth)acrylic acid-(meth)acrylate ester copolymer, partially esterified products of styrene-maleic anhydride copolymer, and hydroxybenzaldehyde-modified polyvinyl alcohol, said one resin being insoluble in distilled water but soluble in or swellable in an aqueous solution having a pH value 10.0 or above.

7. An image-forming material as claimed in claim 3, wherein the transparent resin layer contains at least one resin selected from the group consisting of (meth)acrylic acid-(meth)acrylate ester copolymer, partially esterified products of styrene-maleic anhydride copolymer, and hydroxybenzaldehyde-modified polyvinyl alcohol, said one resin being insoluble in distilled water but soluble in or swellable in an aqueous solution having a pH value 10.0 or above.

8. An image-forming material in accordance with claim 1, wherein:
   said transparent resin layer is formed of a resin selected from the group consisting of (meth)acrylic acid-(meth)acrylate copolymers, (meth)acrylic acid-2-hydroxyethyl (meth)acrylate-(meth)acrylonitrile-meth(acrylate) copolymers, partially esterified styrene-maleic anhydride copolymers, polyvinyl-p-hydroxy-benzal resins, alkali-soluble novolak resins and mixtures thereof; and wherein
   said colored resin non-photosensitive layer is formed of a resin selected from the group consisting of hydroxypropylmethylcellulose phthalate, methylvinylether-maleic anhydride ester copolymers, polyvinylpyrrolidone-vinylacetate copolymers, dimethylamino-modified polyamides, (meth)acrylic acid(meth)acrylic ester copolymers, (meth)acrylic acid-2-hydroxylethyl(meth)acrylate-(meth)acrylonitrile-(meth)acrylate ester copolymer, partially esterified styrene-maleic anhydride copolymers, polyvinylbutyral, polyvinyl-p-hydroxybenzal, alkalisoluble novolak resins and mixtures thereof.

9. An image-forming material in accordance with claim 1 wherein said plastic film is a polyethylene terephthalate film.

10. An image-forming material in accordance with claim 8 wherein said plastic film is a polyethylene terephthalate film.

* * * * *